United States Patent [19]

Fujinaga et al.

[11] Patent Number: 5,416,339
[45] Date of Patent: May 16, 1995

[54] SEMICONDUCTOR DEVICE HAVING ELECTRODE FOR COLLECTING ELECTRIC CHARGE IN CHANNEL REGION

[75] Inventors: Masato Fujinaga; Norihiko Kotani; Tsuyoshi Yamano, all of Hyogo, Japan

[73] Assignee: Mitsubishi Denki Kabushiki Kaisha, Tokyo, Japan

[21] Appl. No.: 590,824

[22] Filed: Oct. 1, 1990

[30] Foreign Application Priority Data

Oct. 11, 1989 [JP] Japan .................. 1-264154
Sep. 11, 1990 [JP] Japan .................. 2-241753

[51] Int. Cl.$^6$ .......................... H01L 29/68
[52] U.S. Cl. .................... 257/29; 257/327; 257/365; 257/901
[58] Field of Search ............ 357/23.14, 23.12, 23.3, 357/23.5, 34; 257/29, 327, 365, 901

[56] References Cited

U.S. PATENT DOCUMENTS

| 4,409,723 | 10/1983 | Harari ................ 257/323 |
| 4,577,212 | 3/1986 | Hueckel et al. ...... 257/767 |
| 4,680,603 | 7/1987 | Wei et al. ............ 257/344 |
| 5,003,365 | 3/1991 | Havemann et al. .... 257/514 |

OTHER PUBLICATIONS

Publication "Basic Knowledge of Quantum-Effect Devices", The Japan Society of Applied Physics, Mar. 1989. (Partial Translation).

*Primary Examiner*—Robert P. Limanek
*Attorney, Agent, or Firm*—Lowe, Price, LeBlanc & Becker

[57] ABSTRACT

A semiconductor device for switching comprises a semiconductor substrate (10), three conductive regions (14, 16, 20) for providing a path for electrons to or from desired locations of the semiconductor substrate (10) formed at locations spaced apart on the surface of the semiconductor substrate (10, 28), a device (22, 24) for causing a current between the first and second conductive regions (14, 16), and a device (18) for forming electric field for diverting the caused current to the third conductive region (20). Since the current flowing to the first and second conductive regions (14, 16) is diverted to the third conductive region (20), switching operation between the first and second conductive regions (14, 16) is implemented.

21 Claims, 8 Drawing Sheets

SEMICONDUCTOR DEVICE HAVING ELECTRODE FOR COLLECTING ELECTRIC CHARGE IN CHANNEL REGION

BACKGROUND OF THE INVENTION

Field of the Invention

This invention relates to a semiconductor device, and more particularly to a high integration technique for a semiconductor device. The present invention further relates to a process of producing a semiconductor device of the type mentioned.

Description of the Related Art

In recent years, to apply the technique of microelectronics to industrial machinery and home appliances, a VLSI (Very-Large-Scale integration) circuit which is a further integrated LSI (Large Scale Integration) is developed and commercially available. In the case of a semiconductor memory device, for example, the storage capacity has been increased a thousand-fold in these ten years. The development of such high integration is realized by miniaturization of the size of a unit element, which constitutes a semiconductor device, by using a method called proportional scaling.

FIG. 1 is a perspective sectional view of a semiconductor device showing a basic structure of a MOS (Metal-Oxide-Semiconductor) field effect transistor (hereinafter referred to briefly as "MOSFET") for use with a conventional semiconductor integrated circuit. The description below about the MOSFET is mainly based on "Physics of Semiconductor Devices (2nd Edition)" by S. M. Sze.

Referring to FIG. 1, the MOSFET shown is a four-terminal element (in the figure, one of the terminals is not shown) and includes a P-type semiconductor substrate 52, two N+ diffused regions 54 and 56 formed in a spaced relationship from each other on a main surface of the P-type semiconductor substrate 52, a gate oxide film 60 formed on a region of the main surface of the P-type semiconductor substrate 52 between the two N+ diffused regions 54 and 56, a gate electrode 62 formed of a metal on the gate oxide film 60, a source electrode 64 made of a metal and provided on the N+ diffused region 54, and a drain electrode 66 made of a metal and provided on the N diffused region 56. A thick field oxide film 58 is provided around the MOSFET and isolates the same from other elements.

The source electrode 64 is connected to a fixed ground potential. A gate voltage $V_G$ is applied to the gate electrode 62. A drain voltage $V_D$ is applied to the drain electrode 66. The P-type semiconductor substrate 52 is connected to a substrate potential equal to or lower than the ground potential.

Basic device parameters which define operation of the MOSFET described above are such as follows.

(1) Channel length L: this is a distance between two N+-P junctions, one between the N+ diffused region 54 and the substrate 52 and the other one between the other N+-P diffused region 56 and the substrate 52 just below the gate electrode 62.

(2) Channel width Z.

(3) Thickness d of the gate oxide film 60.

(4) Junction thickness $r_j$: this is a thickness of diffusion of the N+ diffused regions 54 and 56.

(5) Substrate concentration $N_A$: this is a concentration of an impurity in the P-type semiconductor substrate 52.

Referring to FIG. 1, operation of the MOSFET will be described below. When no voltage is applied to the gate electrode 62, the N+ diffused region 54 and P-type semiconductor substrate 52, and the N+ diffused region 56 and P-type semiconductor substrate 52 correspond to the two P-N junctions connected in a back-to-back relationship. In this instance, an electric current flowing between the N+ diffused regions 54 and 56 is a leak current caused by a reverse-bias voltage.

If a sufficiently high positive voltage is applied to the gate electrode 62, an inversion layer (or "channel") is formed in a region just below the gate electrode 62 between the two N+ diffused regions 54 and 56. The N+ diffused regions 54 and 56 are thus coupled to each other by way of a conducting surface so that a large current is allowed to flow through the channel. The conductivity of the channel thus formed is modulated by the gate voltage $V_G$ to be applied to the gate electrode 62. The back-surface contact (or "substrate contact") of the two P-N junctions is connected to the substrate potential which is selected so that a reverse-bias may be applied to the P-N junctions. In addition to the five device parameters listed hereinabove, also the substrate potential is a parameter which provides a variation to the channel conductivity.

A change in behavior of the MOSFET by a change of the individual device parameters will be described in the following. If, for example, the channel width Z is reduced, the amount of area where field oxide films 58 are formed on the opposite sides of the gate increases relatively. Consequently, the threshold voltage $V_{th}$ of the MOSFET becomes higher. If the thickness d of the gate oxide film 60 increases, also the threshold voltage $V_{th}$ becomes higher. If the junction depth $r_j$ increases, an electric current is formed not just below the gate in the inversion layer but at a relatively deep location of the substrate 52. Consequently, punch-throughs become likely to occur. If the junction depth $r_j$ is small, an electric field will concentrate at edge portions of the N+ diffused regions 54 and 56 on the channel side, causing hot electron effect, resulting in a change of characteristics, and the withstand voltage of the MOSFET becomes low. If the substrate concentration $N_A$ is low, depletion layers around the N+ diffused regions 54 and 56 are likely to expand, whereby punch-throughs are apt to be caused. It is also known that, if the substrate concentration $N_A$ is higher, then the threshold voltage $V_{th}$ becomes higher.

As high integration of semiconductor integrated circuit devices proceeds, the channel length L naturally decreases. As the channel length L decreases, instead of the one-dimensional potential distribution as in a conventional semiconductor integrated circuit device, a two-dimensional potential distribution appears and a high electric field is formed in the channel region.

If it is assumed that the doping concentration in a channel region is predetermined, when the channel length L decreases, the order of the width of depletion layers formed at the P-N junctions between the semiconductor substrate 52 and the N+ diffused regions 54 and 56 becomes similar to that of the channel length L. The potential distribution in a channel region relies upon a longitudinal electric field $\epsilon_y$ and a transverse electric field $\epsilon_x$. The former depends upon the gate potential $V_G$ and the substrate potential. The latter depends upon the drain potential $V_D$. In other words, the gradual-channel approximation of $\epsilon_y \gg \epsilon_x$ no more stands, and the potential distribution in the channel region becomes two-dimensional.

Such two-dimensional potential distribution has an unfavorable influence on the movement of carriers passing through the channel and gives rise to deterioration in characteristics at a voltage of the MOSFET lower than its threshold level. The two-dimensional potential distribution has a bad influence also on relationships of the threshold voltage $V_{th}$ with the channel length L and the bias voltage, giving rise to an undesirable change in characteristics of the MOSFET. Further, also a problem takes place that the electric current is saturated by a punch through.

Increase in electric field intensity in the channel region caused by decrease in channel length L gives rise to reliance on the mobility of carriers moving in the channel region upon the electric field and sometimes results in velocity saturation of carriers. If the electric field intensity further increases, the velocity of carriers moving in the channel becomes very high in the neighborhood of the N+ diffused region 56. The carriers are thus suddenly increased in number in the neighborhood of the N+ diffused region 56 by a large amount of energy of the carriers. Consequently, the substrate current by leakage may be increased, or a parasitic bipolar transistor formed in the semiconductor substrate 52 may be caused to operate.

A high electric field formed due to decrease of the channel length L gives rise to the formation of a plurality of hot carriers, and such hot carriers charge up oxide films such as the gate oxide film 60. Charged-up oxide films often give rise to variation in threshold voltage $V_{th}$ of the MOSFET and hence to deterioration in conductivity of the MOSFET.

As described hereinbefore, the higher the degree of integration of the semiconductor integrated circuit device is, the shorter the channel length L of the MOSFET becomes. The decrease in channel length L complicates the operation of the MOSFET, making the characteristics of the element very unstable. Accordingly, the structure of a semiconductor integrated circuit device at present is difficult to cope with higher integration.

SUMMARY OF THE INVENTION

It is an object of the present invention to provide a semiconductor device which solves the subjects described above and can operate stably even if further high integration is accomplished and to provide a process of producing such semiconductor device.

It is another object of the present invention to provide a semiconductor device which is capable of operating stably while the channel length is small and to provide a process of producing the same.

It is a further object of the present invention to provide a semiconductor device wherein the variation in threshold voltage is small while the channel length is small and to provide a process of producing such semiconductor device.

A still further object of the present invention is to provide a semiconductor device wherein the relationship between the threshold voltage and the channel length is stabilized and to provide a process of producing such semiconductor device.

It is a yet further object of the present invention to provide a semiconductor device which has a small channel length and is small in scattering of carriers in a semiconductor substrate and to provide a process of producing such semiconductor device.

An additional object of the present invention is to provide a semiconductor device which can operate at a high speed and a process of producing such semiconductor device.

It is another additional object of the present invention to provide a semiconductor device which can operate stably at a high speed and a process of producing such semiconductor device.

The objects described above are attained by a semiconductor device including a body of semiconductor material, first, second and third conductive regions connected to spaced apart locations on said body of semiconductor material for providing a path for electrons to or from desired locations of said body of semiconductor material, a device for causing a current between the first and second conductive regions, and a device for diverting the current between the first and second conductive regions to the third conductive region.

A current is caused through a portion between the first and the second conductive regions of the semiconductor material regions. The caused current is diverted to the third conductive regions. Thus, the current flows between the first and the third conductive regions or, between the second and the third conductive regions. The current flowing to the second conductive regions in the former case or to the first conductive region in the latter case disappears, which enables a switching function to be implemented.

Such switching operation does not make use of an inversion layer which is formed in the inside of a semiconductor substrate as in a conventional MOSFET, but is based on a quite different principle of operation that the direction of movement of electrons is changed making use of an electrostatic force. Even if the distance between the first and second conductive regions, or the channel length, is decreased, no unfavorable influence is exerted on the switching operation.

On the contrary, electrons to be scattered are decreased in number, consequently stabilizing device operation. Since the channel length can be reduced, the size of the device can be reduced compared with that of a conventional semiconductor device. Accordingly, it is possible to form a greater number of elements on a smaller area than in a conventional semiconductor device and to cause the elements to operate with a high reliability.

A process of producing a semiconductor device according to the present invention includes the steps of: forming a masking layer having a first predetermined width on a semiconductor substrate of a first predetermined conductivity type having a main surface, the main surface being divided into first and second regions by the masking layer; forming first and second impurity regions of a second conductivity type different from the first conductivity type on the first and second regions, respectively; removing the masking layer, a portion of the main surface from which the masking layer is removed defining a channel region; forming a first conductor layer having a second predetermined width smaller than the first predetermined width on the channel region; forming an isolating layer on the channel region and the first conductor layer; and forming a second conductor layer on the isolating layer.

In a preferred embodiment of the process of producing a semiconductor device according to the present invention, the step of forming first and second impurity regions includes a step of implanting an impurity of the second conductivity type from above the first region into the first region toward the inside of the semiconductor substrate below the masking layer to form the first impurity region.

In another preferred embodiment of the process of producing a semiconductor device according to the present invention, the step of forming first and second impurity regions further includes step of implanting an impurity of the second conductivity type from above the second region into the second region toward the inside of the semiconductor substrate below the masking layer to form the second impurity region.

As the process of producing a semiconductor device includes above-described steps, a semiconductor device according to the present invention can be obtained. The first and second impurity regions are formed, by implanting an impurity obliquely into the semiconductor substrate in such a manner, as described above, that they may extend to locations below the channel region. Accordingly, the distance between the first and second impurity regions presents a smaller value in the inside of the semiconductor substrate than that on the main surface of the semiconductor substrate. As a result, when no voltage is applied to the second conductor layer, electric charge discharged from the first impurity region moves at a location sufficiently distant from the first conductor layer. In this instance, the potential at the second conductor layer does not have an unfavorable influence on travel of electrons. An electric current formed by the travelling electrons still remains stable even if the channel length is extremely small. Since movement of electrons is caused by an electrostatic force, the possibility of punch throughs is low. In other words, a semiconductor device can be produced which can operate stably while having a small channel width.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
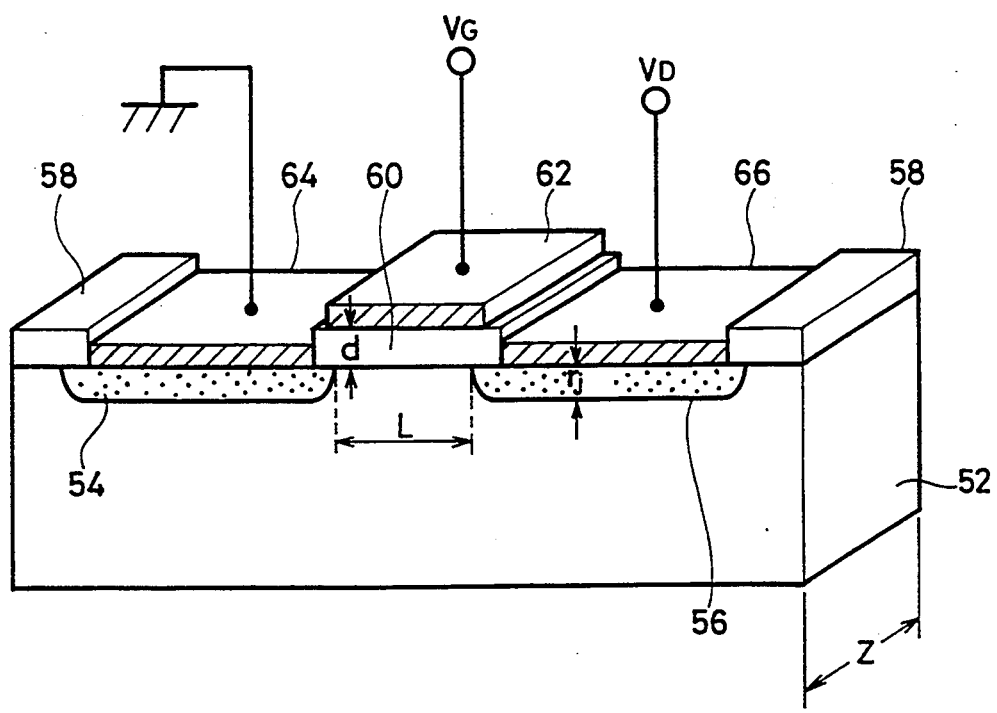
FIG. 1 is a perspective sectional view showing a structure of a conventional MOSFET.
Figure 2A:
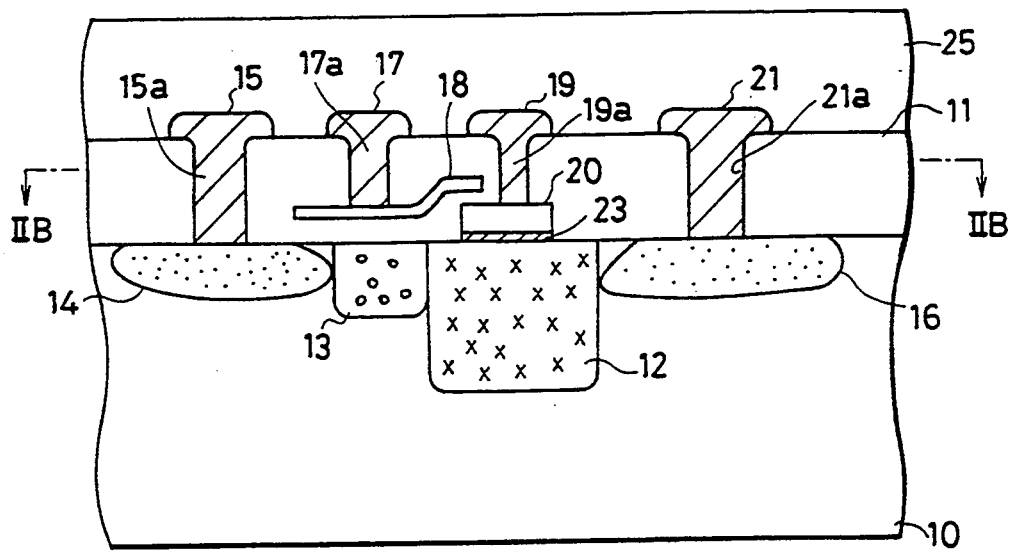
FIG. 2A is a sectional view showing a structure of a semiconductor device of a preferred embodiment of the present invention.
Figure 2B:
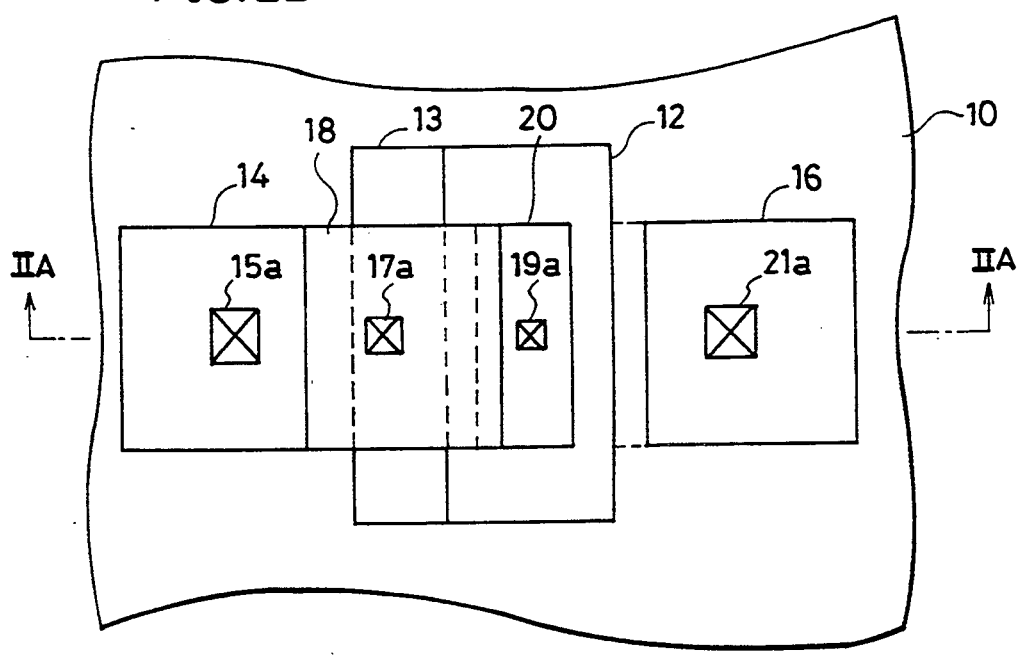
FIG. 2B is a sectional view taken along the IIB—IIB line of FIG. 2A in the direction of the arrow.

Referring first to FIG. 2A and 2B, a semiconductor device according to the present invention includes a P− silicon semiconductor substrate 10, a pair of N+ diffused regions 14 and 16 formed in a spaced relationship from each other by an ion implantation method on a main surface of the P− semiconductor substrate 10, a P+ region 12 formed in a region between the N+ diffused regions 14 and 16 a P− region 13 formed between the P+ region 12 and the N+ diffused region 14, a charge collecting electrode 20 formed of polysilicon at a location on the P+ region 12 nearer to the N+ diffused region 16, and a gate electrode 18 formed in such a manner as to cover the main surface of the P− semiconductor substrate 10 between the charge collecting electrode 20 and the N+ diffused region 14 and isolated from the charge collecting electrode 20. The N+ diffused regions 14 and 16 are formed by an oblique ion implantation method and are most close to each other not on the main surface of the semiconductor substrate 10 but in the inside of the same.

A titanium nitride (TIN) film 23 is formed for avoiding junction between the charge collecting electrode 20 and the P+ region 12 and for providing an ohmic contact between the charge collecting electrode 20 and the main surface of the substrate 10. A thin SiO2 film is formed between the gate electrode 18 and the substrate 10.

An insulator layer 11 composed of SiO2 or the like is formed on the main surface of substrate 10. Contact holes 15a, 17a, 19a and 21a are respectively formed on the N+ diffused region 14, the gate electrode 18, the charge collecting electrode 20 and the N+ diffused layer 16 in the insulator layer 11. In the respective contact holes 15a, 17a, 19a and 21a, the interconnection layers 15, 17, 19 and 21 for respectively connecting the N+ diffused region 14, the gate electrode 18, the charge collecting electrode 20 and the N+ diffused region 16 to given power sources are formed, respectively. Interconnection layers 15, 17, 19 and 21 are formed of metal such as aluminum and tungsten, or of polysilicon.

These semiconductor composites on the surface of the substrate 10 are further covered with protecting film 25.

Figure 2C:
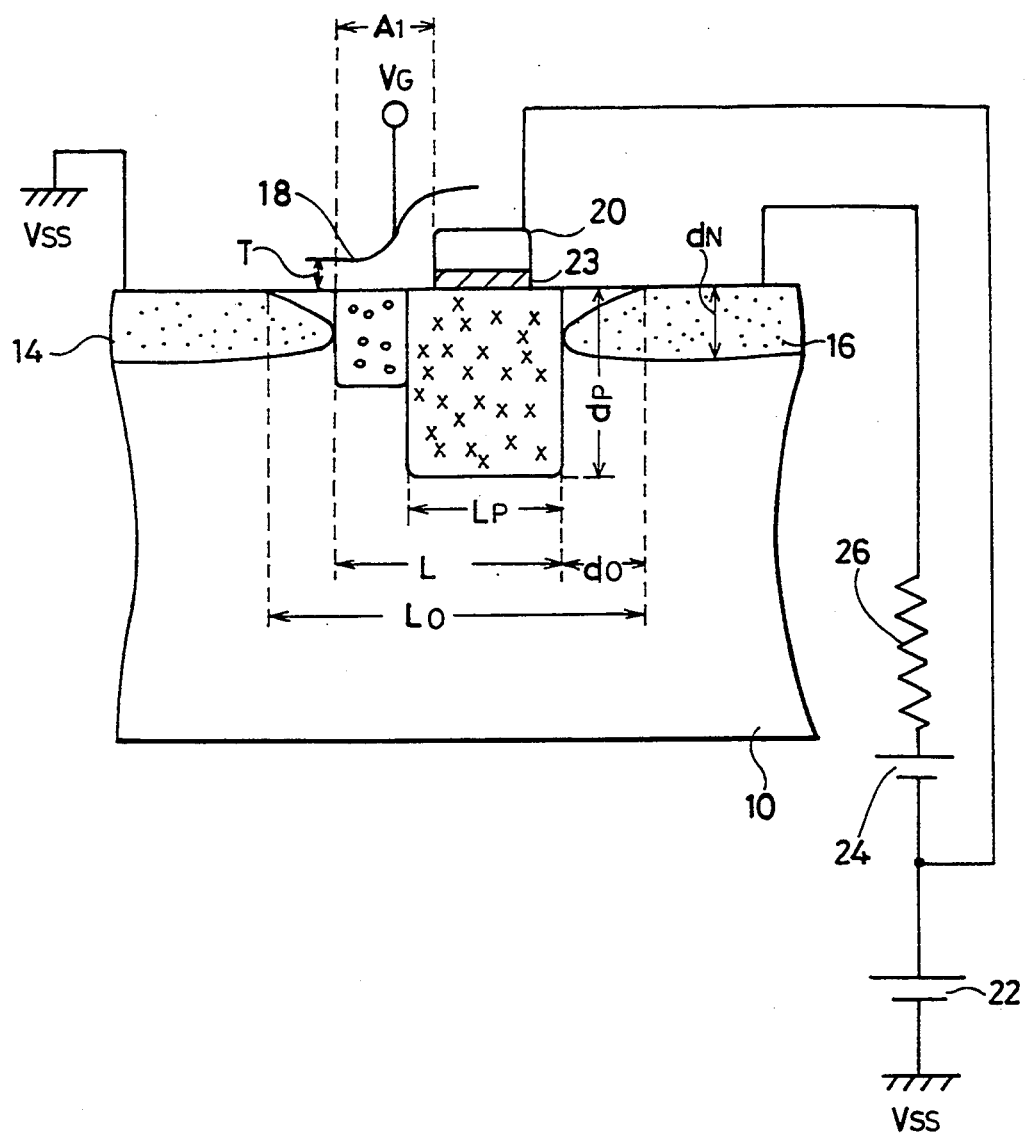
FIG. 2C is a schematic sectional view showing a structure of a semiconductor device of the preferred embodiment of the present invention.

FIG. 2C is a schematic view showing a main portion of the semiconductor device shown in FIGS. 2A and 2B. Referring to FIG. 2C, this semiconductor device has the following dimensions.

It is assumed that the length along the channel length and the depth of the P+ region 12 are $L_p$ and dp, respectively, the shortest distance between the N+ diffused regions 14, 16 is L, the distance Lo of the N+ diffused regions 14, 16 on the main surface of the substrate 10 is Lo, the depth of the N+ diffused regions 14, 16 is $d_N$, and that the length of the edge of the N+ diffused regions 14, 16 is do.

Lp, dp, L, Lo, dN, do are selected in a range satisfying the relationship shown by the following expressions (1)–(3).

$$1.0 < \frac{L}{L_p} < 1.5 \qquad (1)$$

$$\frac{Lo - 2do}{Lo} = \frac{L}{Lo} < 1.0 \qquad (2)$$

-continued $$2.0 < \frac{d_P}{d_N} \quad (3)$$

According to the expression (1), the length of the P+ region 12 is shorter than the distance between the N+ diffused regions 14, 16. In this way, the P− region 13 can be provided between the P+ region 12 and the N+ diffused region 14. The P− region 13 is for forming a depletion layer or a channel in the substrate 10 below the gate electrode 18. Because of the existence of the P− region 13, a strong electric field is produced in the channel region upon application of voltage between the N+ diffused regions 14, 16. It should be noted that the depletion layer or the channel does not further extend because of the P+ region 12.

The expression (2) defines conditions for forming edges of the N+ diffused regions 14, 16 to enhance the electric field in the vicinity thereof.

The expression (3) shows that the depth of the P+ region 12 should be sufficiently larger than the depth of the N+ diffused regions 14, 16. With the depth of the P+ legion 12 satisfying the expression (3), the depletion layer produced below the gate electrode 18 does not extend to cause punch through.

Specific examples of dimensions of the element are shown below. Referring to FIG. 2B, the N+ diffused regions 14, 16 have dimensions of about 0.1 μm in both of length and width.

Referring to FIG. 2C, the thickness T of the SiO₂ film between the gate electrode 18 and the main surface of the substrate 10 is approximately 0.1 μm or less. The distance L between the N+ diffused regions 14, 16 is less than 0.1 μm. The distance $A_1$ between the left side edge of the charge collecting electrode 20 and the N+ diffused region 14 is about 0.03 μm.

The depth $d_N$ of the N+ diffused regions 14, 16 is about 0.1 μm. The distance Lo between the N+ diffused regions 14, 16 on the main surface of the substrate 10 is about 0.3 μm. The angle Θ between edge portions of the N+ diffused regions 14, 16 and the main surface of the substrate 10 is about 45°.

The substrate 10 includes impurity B, of which concentration is about $10^{15}$ A/cm³. The impurity concentration of the P+ region 12 is about $10^{19}$ A/cm³. The impurity concentration of the P− region 13 is almost the same as that of the substrate 10 or less. The N+ diffused regions 14, 16 include As of approximately $10^{20}$ A/cm³ in concentration.

Referring to FIG. 2C again, the N+ diffused region 14 is connected to a ground potential $V_{ss}$. The charge collecting electrode 20 is connected to the ground potential $V_{ss}$ by way of a first power source 22, a second power source 24 and a load 26. The charge collecting electrode 20 is connected to the ground electrode $V_{ss}$ by way of the first power source 22. The gate electrode 18 is connected to a gate potential $V_G$. Accordingly, the potential at the charge collecting electrode 20 is selected lower than the potential at the N+ diffused region 16.

Figure 3A:
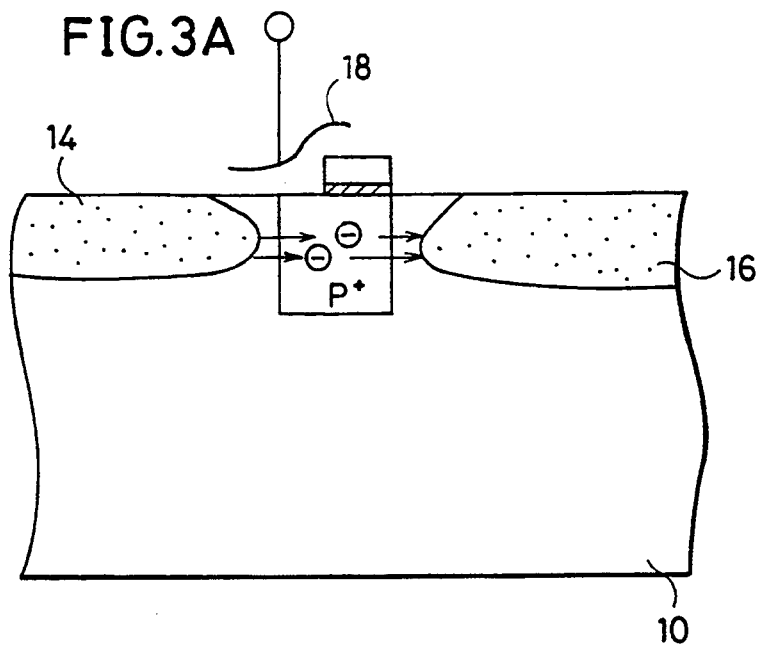
FIGS. 3A and 3B are schematic sectional views illustrating operation of the semiconductor device of the embodiment according to the present invention.
Figure 3B:
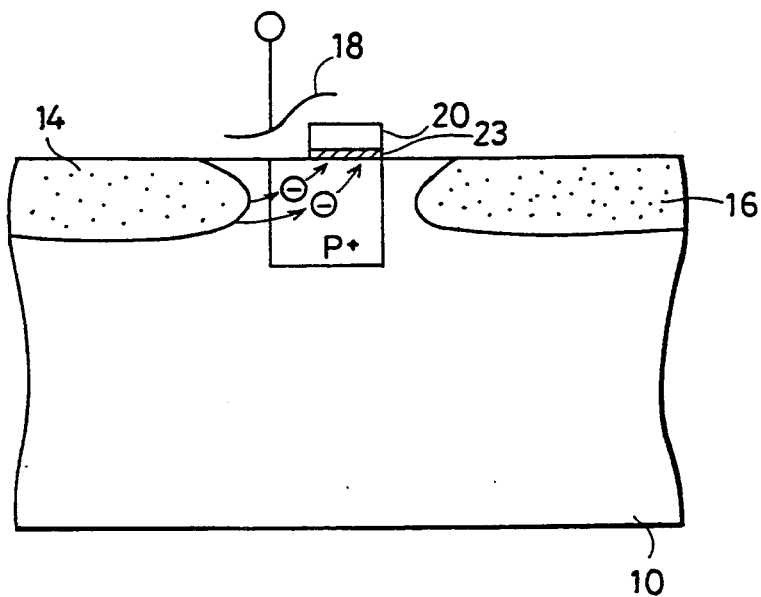

With reference to FIGS. 2A, 3A and 3B, the semiconductor device of the embodiment of the present invention operates as follows. A predetermined voltage (5 volts or so) is applied across the N+ diffused regions 14 and 16. Referring to FIG. 3A, electrons are discharged from an end of the N+ diffused region 14 nearest to the N+ diffused region 16 because of the strong electric field produced around there. Since the distance between the n+ diffused regions 14 and 16 is selected shorter than or similar to a mean free path of electrons in the semiconductor substrate 10, the electrons discharged will advance along the electric field without being scattered in the semiconductor substrate 10.

When no voltage is applied to the gate electrode 18, the electrons discharged are accelerated by the electric field between the N+ diffused regions 14 and 16 so that they will reach the N+ diffused region 16 without being scattered. This is called "ballistic effect". In this instance, an electric current flows between the N+ diffused regions 14 and 16.

Referring now to FIG. 3B, it is assumed that a positive voltage is applied to the gate electrode 18. Electrons discharged from the N+ diffused region 14 are deflected to the gate electrode 18 by an electrostatic attraction between the gate electrode 18. The electrons thus pass sufficiently near the charge collecting electrode 20 so that they are caught by an electric field of the charge collecting electrode 20 and absorbed by the same. Accordingly, in this instance, no electric current flows between the N+ diffused regions 14 and 16.

In other words, the element can be used as a switching element by controlling the gate voltage $V_G$ to be applied to the gate electrode 18.

Such a distance between the N+ diffused regions 14 and 16 as will cause a ballistic effect depends upon a type of the semiconductor substrate 10. For example, if a silicon substrate is used, it is predicted that such a ballistic effect as described above will take place if the distance between the N+ diffused regions 14 and 16 is set to a value smaller than 1 μm. Travelling electrons will not be scattered by the semiconductor substrate 10. Accordingly, very high speed operation can be realized with a switching element which makes use of such a ballistic effect as described above.

As apparently seen from FIGS. 3A and 3B, the principle of switching operation of the semiconductor device according to the present invention is thoroughly different from that of a conventional MOSFET. The region between the N+ diffused regions 14 and 16 is called channel herein as in a MOSFET. Then, even if the channel length L thereof is reduced significantly, the semiconductor device can be controlled stably by only modulating the gate voltage $V_G$, and such disadvantages as will occur in a conventional MOSFET do not occur at all.

In the first embodiment, the P+ region 12 and the P− region 13 are provided in the channel region. The P− region 13 is for producing strong electric field around the edge of the N+ diffused region. The P+ region 12 is provided in order to prevent growth of a depletion layer in the P− region 13 in the channel region. Accordingly, as long as it can prevent the growth of a depletion layer, any other structure can be employed to realize a semiconductor device according to the present invention.

Figure 4:
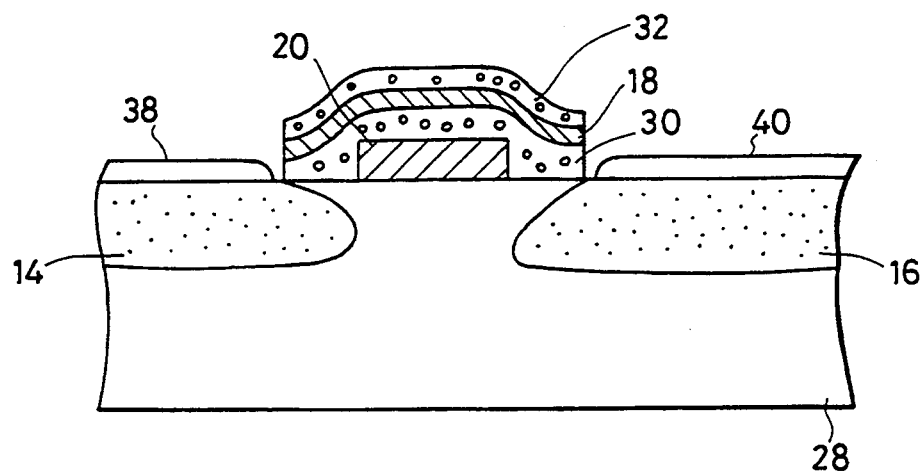
FIG. 4 is a sectional view showing a second preferred embodiment of a semiconductor device according to the present invention.

Referring to FIG. 4, the semiconductor device according to the second embodiment of the present invention includes a P+ semiconductor substrate 28, a pair of N+ diffused regions 14 and 16 formed in a spaced relationship from each other on a main surface of the semiconductor substrate 28, a charge collecting electrode 20 formed of aluminum or the like on a channel region of the main surface of the semiconductor substrate 28 between the N+ diffused regions 14 and 16, a silicon oxide film 30 formed on the charge collecting electrode 20, a gate electrode 18 formed of aluminum or the like on the silicon oxide film 30, and another silicon oxide film 32 formed on the gate electrode 18. A source electrode 38 formed of aluminum or the like is provided on the N+ diffused region 14. A drain electrode 40 formed of aluminum or the like is provided similarly on the N+ diffused region 16.

The device shown in FIG. 4 is different from the device shown in FIG. 2 in that the charge collecting electrode 20 is formed proximate the center of the channel region, that the gate electrode 18 is formed in such a manner as to cover the entire channel region and that the P+ semiconductor substrate 28 is used instead of the provision of the P+ region 12 in the P+ semiconductor substrate 10.

From the principle of operation of a semiconductor device of the present invention, it is considered that it is effective to provide the charge collecting electrode 20 at a location on the channel region nearer to the N+ diffused region 16 as shown in FIG. 2. However, similar effects are attained even if the charge collecting electrode 20 is provided at a location near the center of the channel region as illustrated by the second embodiment.

While the gate electrode 18 may be formed in such a manner as to cover at least the channel region between the N+ diffused region 14 and the charge collecting electrode 20, quite similar effects can be exhibited even with such a gate electrode 18 which covers the entire channel area as shown in FIG. 4. By forming the gate electrode 18 in this way, this element can operate as a bidirectional switching element. Further, the manufacturing of the device can be facilitated.

As described hereinabove in connection with the first embodiment, the P+ region 12 in FIG. 2 is provided to prevent possible formation of a depletion layer in the channel region. Accordingly, quite similar effects can be attained even with such a semiconductor device which adopts a P+ semiconductor substrate 28 as the semiconductor device of the second embodiment shown in FIG. 4.

Operation of the semiconductor device of the second embodiment shown in FIG. 4 is quite similar to that of the semiconductor device of the first embodiment shown in FIG. 2. Corresponding elements are denoted by like reference characters and referred to by like names. Accordingly, detailed description of them will not be repeated here.

Figure 5A:
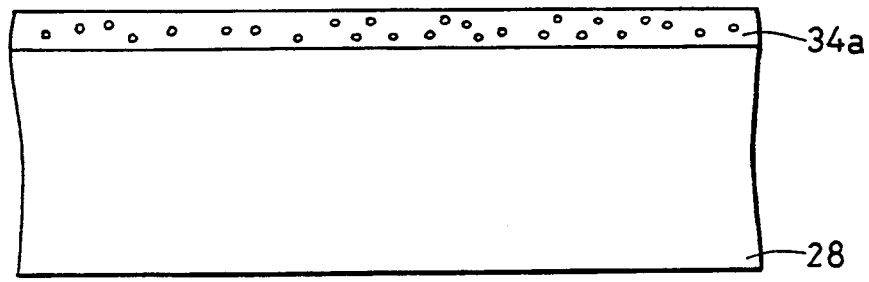
FIGS. 5A to 5J are sectional views showing different steps of a process of production of the semiconductor device according to the second embodiment of the present invention.

FIGS. 5A to 5J are sectional views showing different steps of a process of production of the semiconductor device according to the second embodiment of the present invention. Referring first to FIG. 5A, a silicon oxide film 34a is deposited on the main surface of a P+ semiconductor substrate 28.

Figure 5B:
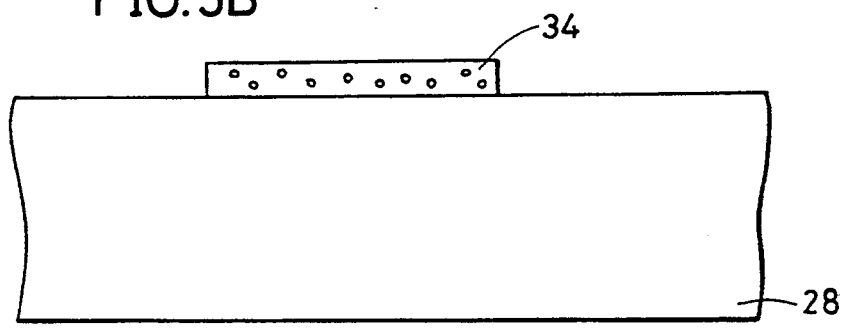

Referring now to FIG. 5B, the silicon oxide film 34a is etched to form a silicon oxide film 34 having a predetermined width The width of the silicon oxide film 34 defines the width of a channel region on the main surface of the semiconductor substrate 28.

Figure 5C:
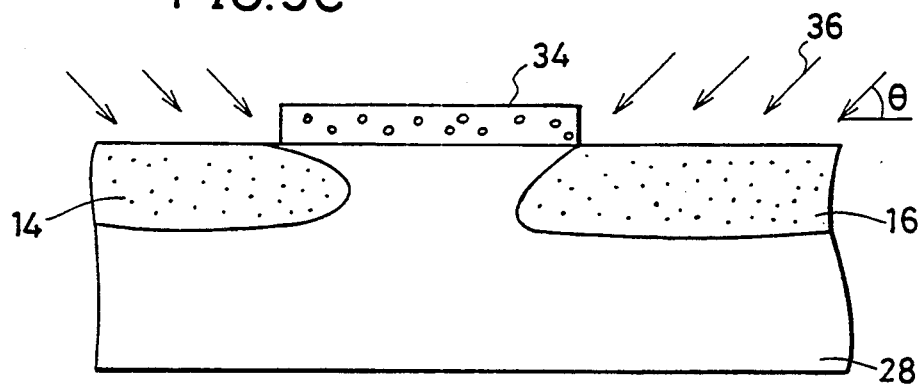

Referring to FIG. 5C, an N+ diffused region 14 and another N+ diffused region 16 are formed by an oblique ion implantation method using the silicon oxide film 34 as a mask. In this instance, the directions of ions 36 implanted into the N+ diffused regions 14 and 16 are opposite to each other. Accordingly, the N+ diffused regions 14 and 16 are formed in such a configuration that the distance therebetween is at its minimum value at ends thereof below the silicon oxide film 34.

Figure 5D:
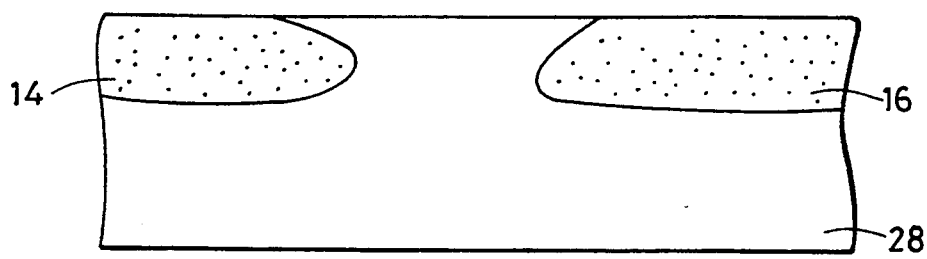

Referring to FIG. 5D, the silicon oxide film 34 is removed by etching.

Figure 5E:
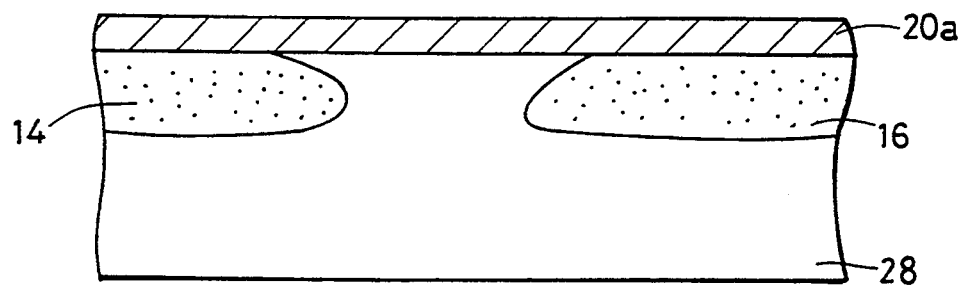

Referring to FIG. 5E, an aluminum film 20a is formed on the semiconductor substrate 28 and N+ diffused regions 14 and 16.

The angle $\Theta$ formed between the ion implantation direction and the main surface of the substrate 28 is selected in the range of 70°–20°. This is because an edge is not formed if $\Theta$ is larger than 70° and similarly, an edge is not formed due to diffusion of ions in the substrate, if it is smaller than 20°.

Figure 5F:
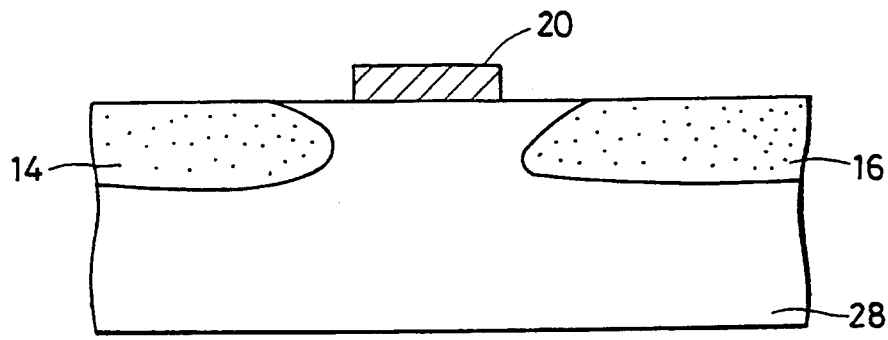

Referring to FIG. 5F, the aluminum film 20a is etched to form a charge collecting electrode 20 of aluminum. The width of the charge collecting electrode 20 is selected such that, where the P+ semiconductor substrate 28 is made of silicon, it may have a value smaller than or equal to 0.1 $\mu$m, for example.

Figure 5G:
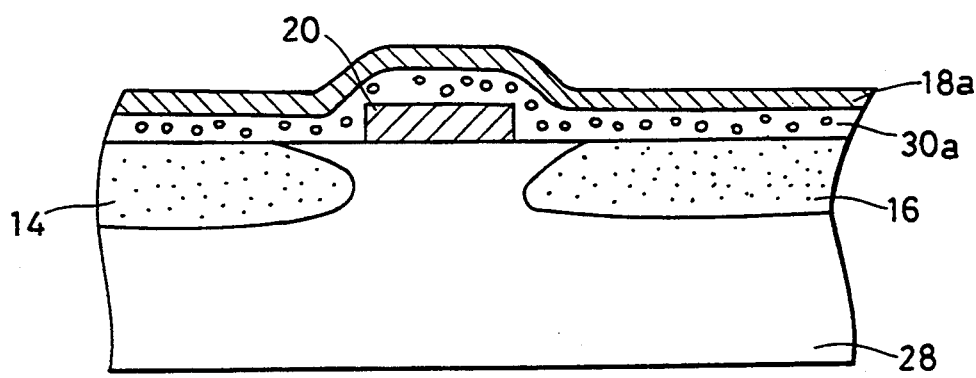

Referring to FIG. 5G, a silicon oxide film 30a is formed with a thickness of 200 to 300Å on the semiconductor substrate 28, N+ diffused regions 14 and 16 and charge collecting electrode 20. Further, an aluminum layer 18a is formed on the silicon oxide film 30a.

Figure 5H:
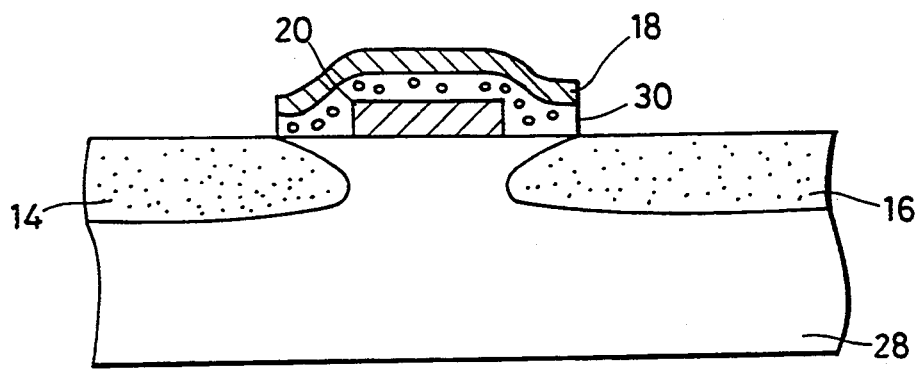

Referring to FIG. 5H, the silicon oxide film 30a and the aluminum layer 18a are both etched to form a silicon oxide film 30 covering the channel region and a gate electrode 18 which is composed of the aluminum layered on the silicon oxide film 30.

Figure 5I:
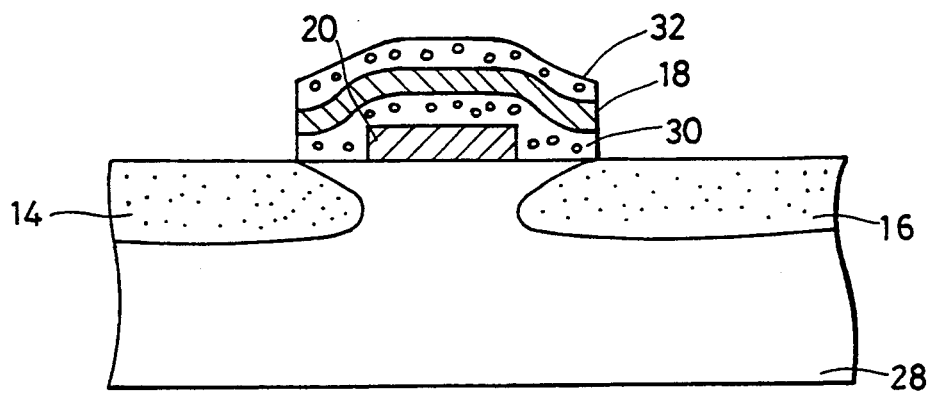

Referring to FIG. 5I, a silicon oxide film is further formed on the gate electrode 18 and then etched to form a silicon oxide film 32 which covers the gate electrode 18.

Figure 5J:
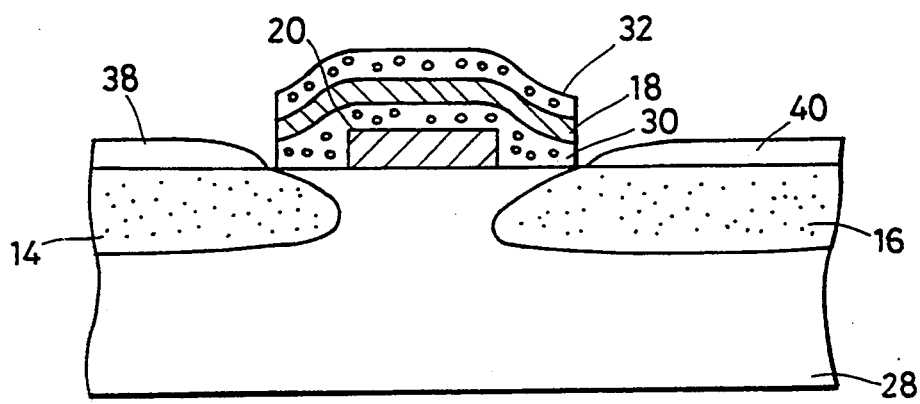

Referring to FIG. 5J, a source electrode 38 made of aluminum is formed on the N+ diffused region 14. A drain electrode 40 made of aluminum is formed similarly on the N+ diffused region 16.

The semiconductor device according to the second embodiment of the present invention shown in FIG. 4 is produced through the steps described above.

It is to be noted that, while the silicon oxide films 30 and 32 are provided for isolation in the embodiment described above, those films need not necessarily be formed of silicon oxide but may be formed, for example, of silicon nitride films.

As described so far, according to the present invention, a switching element having a channel width smaller than or equal to 0.1 $\mu$m can be formed on a semiconductor substrate made of silicon, for example. Since the semiconductor device according to the present invention operates based on the principle of operation fundamentally different from that of a conventional MOSFET, it can be controlled sufficiently as a switching element even with such a small channel length.

MOSFET in a semiconductor device at present has a channel length of 0.5 $\mu$m or so, and the storage capacity of a dynamic random access memory (DRAM) which is put to practical use with such semiconductor device is 16 megabytes or so. It is predicted that, if the channel length is reduced to 0.3 $\mu$m or so, then a DRAM of 64 megabytes will be put to practical use, and if the channel length is reduced to as far as 0.2 $\mu$m or so, then a DRAM of 256 megabytes will be put to practical use. It is possible to realize a DRAM of 1 gigabit with such a semiconductor device as of the present invention having a channel length smaller than 0.1 $\mu$m. Realization of such a device is very difficult with a conventional semiconductor device.

As described also in the foregoing description, a semiconductor device according to the present invention makes use of a ballistic effect. Due to such ballistic effect, electrons discharged from the source will be accelerated by an electric field and consequently jump into the drain or the charge collecting electrode without being scattered. Consequently, the required time of operation of a semiconductor device according to the present invention decreases from the order of nanoseconds (nsec) at present to the order of picoseconds (psec). Accordingly, also there is an effect that operation of a further higher speed becomes possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a body of semiconductor material;
   first, second and third conductive means connected to spaced apart locations on said body of semiconductor material for providing a path for electrons to or from desired locations of said body of semiconductor material;
   means for applying a predetermined potential across said first and second conductive means to cause a current to flow between said first and second conductive means; and
   electrode means for diverting said current between said first and second conductive means through said third conductive means to said means for applying a predetermined potential said electrode means for diverting being arranged over said body of semiconductor material.

2. A semiconductor switching device as recited in claim 1, further including:
   means for suppressing formation of a depletion layer in at least a portion of said body of semiconductor material.

3. A semiconductor device as recited in claim 2, wherein
   said semiconductor material is of a first conductivity type of a predetermined first concentration, and
   said suppressing means comprises;
   an impurity region of said first conductivity type of a second concentration higher than said first concentration, formed at least in a portion of said body of semiconductor material.

4. A semiconductor device as recited in claim 2, further comprising:
   means for helping a depletion layer develop in at least a portion of said body of semiconductor material between said suppressing means and said first conductive means.

5. A semiconductor device as recited in claim 4, wherein,
   said body of semiconductor material is of a first conductivity type of a predetermined first concentration, and
   said means for helping a depletion layer develop includes an impurity region of said first conductivity type of a second concentration lower than said first concentration, formed in a portion of said body of semiconductor material.

6. A semiconductor device as recited in claim 1, further including:
   means for establishing a preferential path for said current within said body of said semiconductor material near a surface of said body of said semiconductor material.

7. A semiconductor device as recited in claim 1, wherein,
   said third conductive means is located nearer to said second conductive means than to said first conductive means.

8. A semiconductor device as recited in claim 1, wherein
   said electrode means for diverting said current to said third conductive means comprises; means for forming potential gradient in a direction crossing
   the surface of said body of semiconductor material within said body of semiconductor material between said first conductive means and said third conductive means.

9. A semiconductor device comprising:
   a body of semiconductor material;
   first, second and third conductive means connected to spaced apart locations on said body of semiconductor material for providing a path for electrons to or from desired locations of said body of semiconductor material;
   means for applying a predetermined potential across said first and second conductive means to cause a current to flow between said first and second conductive means; and
   means for diverting said current between said first and second conductive means through said third conductive means to said means for applying a predetermined potential said means for diverting being arranged over said body of semiconductor material, wherein
   said means for diverting said current to said third conductive means comprises;
   means for forming potential gradient in a direction crossing the surface of said body of semiconductor material within said body of semiconductor material between said first conductive means and said third conductive means, and wherein
   said means for forming potential gradient includes
   an insulating film formed on said surface of said body of semiconductor material and,
   a conductive layer formed on said insulating film.

10. A semiconductor device as recited in claim 8, wherein
    said electrode means for diverting said current to said third conductive means further comprises;
    means for forming potential gradient in a direction crossing said surface of said body of semiconductor material within said body of semiconductor material between said second conductive means and said third conductive means.

11. A semiconductor device comprising:
    a body of semiconductor material;
    first, second and third conductive means connected to spaced apart locations on said body of semiconductor material for providing a path for electrons to or from desired locations of said body of semiconductor material;
    means for applying a predetermined potential to flow between said first and second conductive means to cause a current flow between said first and second conductive means;
    electrode means for diverting said current between said first and second conductive means to said third conductive means; and means for establishing a preferential path for said current within said body of said semiconductor material near a surface of said body of said semiconductor material, wherein said semiconductor material is of a predetermined first conductivity type, said first and second conductive means include first and second impurity regions of a second conductivity type different from said first conductivity type formed at spaced apart locations on the surface of said body of semiconductor material, and said means for establishing said preferential path of current includes a projection of a first impurity region attached thereto and arranged to be nearer to said second impurity region within said body of said semiconductor material than at the surface of said body of semiconductor material.

12. A semiconductor device as recited in claim 11, wherein said means for establishing the preferential path for current further comprises:

a projection of a second impurity region nearer to said first impurity region within said body of semiconductor material as compared to the surface of said body of semiconductor material provided in a portion of said second impurity region facing said first impurity region.

13. A semiconductor device comprising:

a body of semiconductors material;

first, second and third conductive means connected to spaced apart locations on said body of semiconductor material for providing a path for electrons to or from desired locations of said body of semiconductor material;

means for applying a predetermined potential between said first and second conductive means in contact with both said first and second conductive means to cause a current to flow between said first and second conductive means; and electrode means for diverting said current between said first and second conductive means to said third conductive means, wherein said third conductive means includes a conductive layer formed in a region between said first and second conductive means on the surface of said body of semiconductor material.

14. A semiconductor device as recited in claim 13, wherein said conductive layer further comprises:

a metal layer formed on said surface of said body of semiconductor material, and a polysilicon layer formed on said metal layer.

15. A semiconductor device as recited in claim 12, wherein the distance between projections of said first and second impurity regions is selected equal to or shorter than a mean free path of electrons in said body of semiconductor materials.

16. A semiconductor device as recited in claim 1, wherein said means for applying a predetermined potential is connected to said second and third conductive means.

17. A semiconductor device as recited in claim 1, wherein said means for applying a predetermined potential further applies a potential to said third conductive means, said potential at said third conductive means being lower than a potential at said second conductive means when a current is caused to flow between said first and second conductive means.

18. A semiconductor device as recited in claim 1, wherein a distance between said first conductive means and said second conductive means within said body of semiconductor material is less than or equal to a mean free path of electron movement within said body of semiconductor material.

19. A semiconductor device as recited in claim 3, wherein said suppressing means has a predetermined depth within said body of semiconductor material, and said first and second conductive means have a predetermined depth within said body of semiconductor material, said predetermined depth of said suppressing means expressed as $D_p$ and said predetermined depth of said first and second conductive means expressed as $D_n$ being selected so that a ratio of $D_p/D_n$ is greater than 2.

20. A semiconductor device as recited in claim 19, wherein said suppressing means has a predetermined width expressed as $L_p$, and a predetermined distance expressed as L between said first conductive means and said second conductive means within said body of semiconductor material along a line where said first and second conductive means are closest to each other, said distance L and said distance $L_p$ being selected so that a ratio of $L/L_p$ is greater than 1.0 and less than 1.5.

21. A semiconductor device as recited in claim 1, wherein said current between said first and second conductive means is prevented from reaching said second conductive means by an electrostatic force generated by said means for diverting said current.

* * * * *